(12) United States Patent  
Sukegawa et al.

(10) Patent No.: US 7,712,663 B2  
(45) Date of Patent: May 11, 2010

(54) COMMUNICATION BOARD

(75) Inventors: Shunichi Sukegawa, Ibaraki (JP); Takeo Sekino, Saitama (JP); Kenichi Shigenami, Kanagawa (JP); Shinichi Toi, Kanagawa (JP); Tatsuo Shimizu, Chiba (JP)

(73) Assignee: Sony Corporation, Tokyo (JP)

( * ) Notice: Subject to any disclaimer, the term of this patent is extended or adjusted under 35 U.S.C. 154(b) by 970 days.

(21) Appl. No.: 11/473,160

(22) Filed: Jun. 23, 2006

(65) Prior Publication Data

US 2007/0001270 A1 Jan. 4, 2007

(30) Foreign Application Priority Data

Jul. 4, 2005 (JP) ............................. 2005-195444

(51) Int. Cl.
*G06K 7/08* (2006.01)
(52) U.S. Cl. .................. 235/451; 235/450; 235/487
(58) Field of Classification Search ................ 235/380, 235/382, 382.5, 487, 494, 451, 450
See application file for complete search history.

(56) References Cited

U.S. PATENT DOCUMENTS

2005/0045729 A1* 3/2005 Yamazaki ................... 235/492

* cited by examiner

*Primary Examiner*—Karl D. Frech
(74) *Attorney, Agent, or Firm*—Oblon, Spivak, McClelland, Maier & Neustadt, L.L.P.

(57) ABSTRACT

A communication board mounted on an electronic device includes a plurality of antennas configured to transmit and/or receive a signal by electromagnetic induction, where each of the plurality of antennas is provided on a substrate, as a coil-shaped pattern, a semiconductor chip mounted on the substrate, the semiconductor chip including at least one of a transmission circuit which transmits a signal to the antenna and a reception circuit which receives a signal transmitted from the antenna, and an input-and-output end that is connected to the semiconductor chip via a wiring layer provided on the substrate and an electronic circuit of the electronic device. The communication board communicates with a communication board mounted on another electronic device via the antenna by electromagnetic induction.

6 Claims, 13 Drawing Sheets

COMMUNICATION BOARD

CROSS REFERENCES TO RELATED APPLICATIONS

The present invention contains subject matter related to Japanese Patent Application JP 2005-195444 filed in the Japanese Patent Office on Jul. 4, 2005, the entire contents of which are incorporated herein by reference.

BACKGROUND OF THE INVENTION

1. Field of the Invention

The present invention relates to a communication board and particularly relates to a communication board that can perform high-speed communications, so as to easily transmit and/or receive large-capacity data between electronic devices.

2. Description of the Related Art

The applicant of the present invention had proposed technologies for adding and changing the function of an electronic device by mounting a removable block onto the electronic block, and changing the block and/or adding another block for mounting, as disclosed in Japanese Unexamined Patent Application Publication No. 2003-333541. The above-described technologies facilitate adding and/or changing the function of an electronic device.

SUMMARY OF THE INVENTION

Electrical-wiring communications using a narrow bus are often performed between electronic devices due to an electrical trouble and/or a mechanical trouble which occurs in a signal-connection unit of an interface. In that case, there is a limit to a frequency due to impedance mismatching which occurs in wiring and/or a junction and the data-transfer rate is restricted. Therefore, a multi-bit signal is often serialized and transferred. Subsequently, the data latency increases, which makes it difficult to transmit and/or receive large-capacity information with high speed.

Accordingly, the present invention has been achieved, so as to transmit and/or receive large-capacity information between electronic devices with facility and high speed.

A communication board according to an embodiment of the present invention includes a plurality of antennas configured to transmit and/or receive a signal by electromagnetic induction, where each of the plurality of antennas is provided on a substrate, as a coil-shaped pattern, a semiconductor chip mounted on the substrate, the semiconductor chip including at least one of a transmission circuit which transmits a signal to the antenna and a reception circuit which receives a signal transmitted from the antenna, and an input-and-output end that is connected to the semiconductor chip via a wiring layer provided on the substrate and an electronic circuit of the electronic device. The communication board communicates with a communication board via the antenna by electromagnetic induction.

The substrate includes a plurality of wiring layers and the antenna is formed by an outermost wiring layer.

Each of at least one of a plurality of the transmission circuits and at least one of a plurality of the reception circuits is an asynchronous circuit and each of the other transmission circuits and reception circuits is a synchronous circuit. The communication board further includes an adjustment circuit configured to adjust a phase of a clock signal on the basis of a signal transmitted from the asynchronous reception circuit, where the clock signal is transmitted to the synchronous reception circuit.

The communication board includes both the transmission circuit and the reception circuit. The antenna is connected to an output of the transmission circuit and an input of the reception circuit, and each of the transmission circuit and the reception circuit has an end which is set to an enable state and/or a disable state independently.

According to another embodiment of the present invention, there is provided a communication board including an antenna. The communication board is mounted on an electronic device. The communication board communicates with a communication board mounted on another electronic device via the antenna by electromagnetic induction.

Thus, an embodiment of the present invention facilitates transmitting and/or receiving large-capacity information between electronic devices with high speed.

DESCRIPTION OF THE PREFERRED EMBODIMENTS

Before describing embodiments of the present invention, the correspondence between the features of the claims and the specific elements disclosed in embodiments of the present invention is discussed below. This description is intended to assure that specific elements disclosed in an embodiment supporting the claimed invention are described in this specification. Thus, even if an element in an embodiment is not described as relating to a certain feature of the present invention, that does not necessarily mean that the element does not relate to that feature of the claims. Conversely, even if an element is described herein as relating to a certain feature of the claims, that does not necessarily mean that the element does not relate to other features of the claims.

Figure 1:
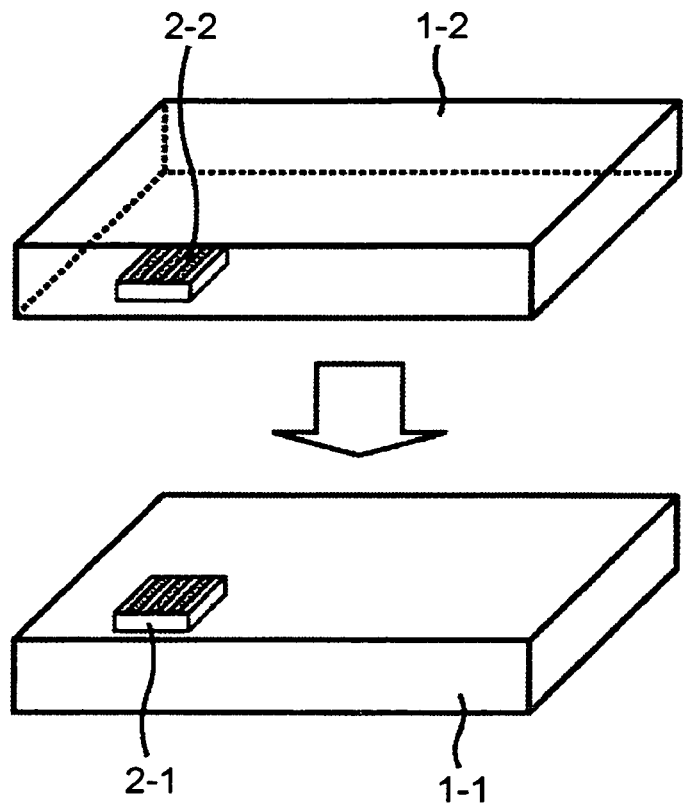
FIG. 1 is a perspective view illustrating the configuration of an embodiment of the present invention.

For example, a communication board 2-1 according to an embodiment of the present invention is configured, as shown in FIG. 1. Namely, the communication board 2-1 includes a plurality of antennas 111 shown in FIG. 5. Each of the antennas 111 is provided on a substrate 101 shown in FIG. 5, as a coil-shaped pattern. The communication board further includes at least one of a transmission circuit configured to transmit a signal to the above-described antenna and a reception circuit configured to receive a signal transmitted from the above-described antenna. The transmission circuit includes a transmission circuit 253 shown in FIG. 9 and a transmission circuit 273 shown in FIG. 10, for example. The reception circuit includes a reception circuit 254 shown in FIG. 9 and a reception circuit 274 shown in FIG. 10, for example. The communication board 2-1 further includes a semiconductor chip including a mount chip 112 shown in FIG. 5, the mount chip 112 being mounted on the substrate 101, and an input-and-output terminal 114 shown in FIG. 5. The input-and-output terminal 114 is connected to the mount chip 112 via a wiring layer 113 shown in FIG. 5, where the wiring layer 113 is provided on the substrate 101, and electronic circuits of an electronic device, where the electronic circuits include electronic circuits 231-1 and 231-2 shown in FIG. 8, for example. The communication board 2-1 is mounted on an electronic device 1-1 shown in FIG. 1, for example, so as to communicate with a communication board 2-2 shown in FIG. 1, the communication board 2-2 being mounted on another electronic device such as an electronic device 1-2 shown in FIG. 1, via the above-described antennas 111.

Figure 6:
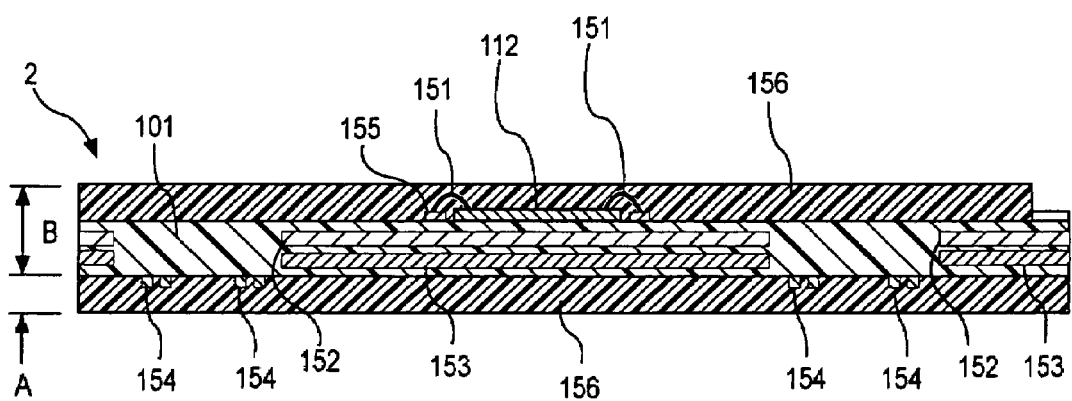
FIG. 6 is a sectional view showing a section of the communication board shown in FIG. 5.

The substrate 101 includes a plurality of wiring layers such as wiring layers 152, 153, and 154 shown in FIG. 6. The antennas 111 are formed by outermost wiring layers such as the wiring layers 154.

Figure 7:
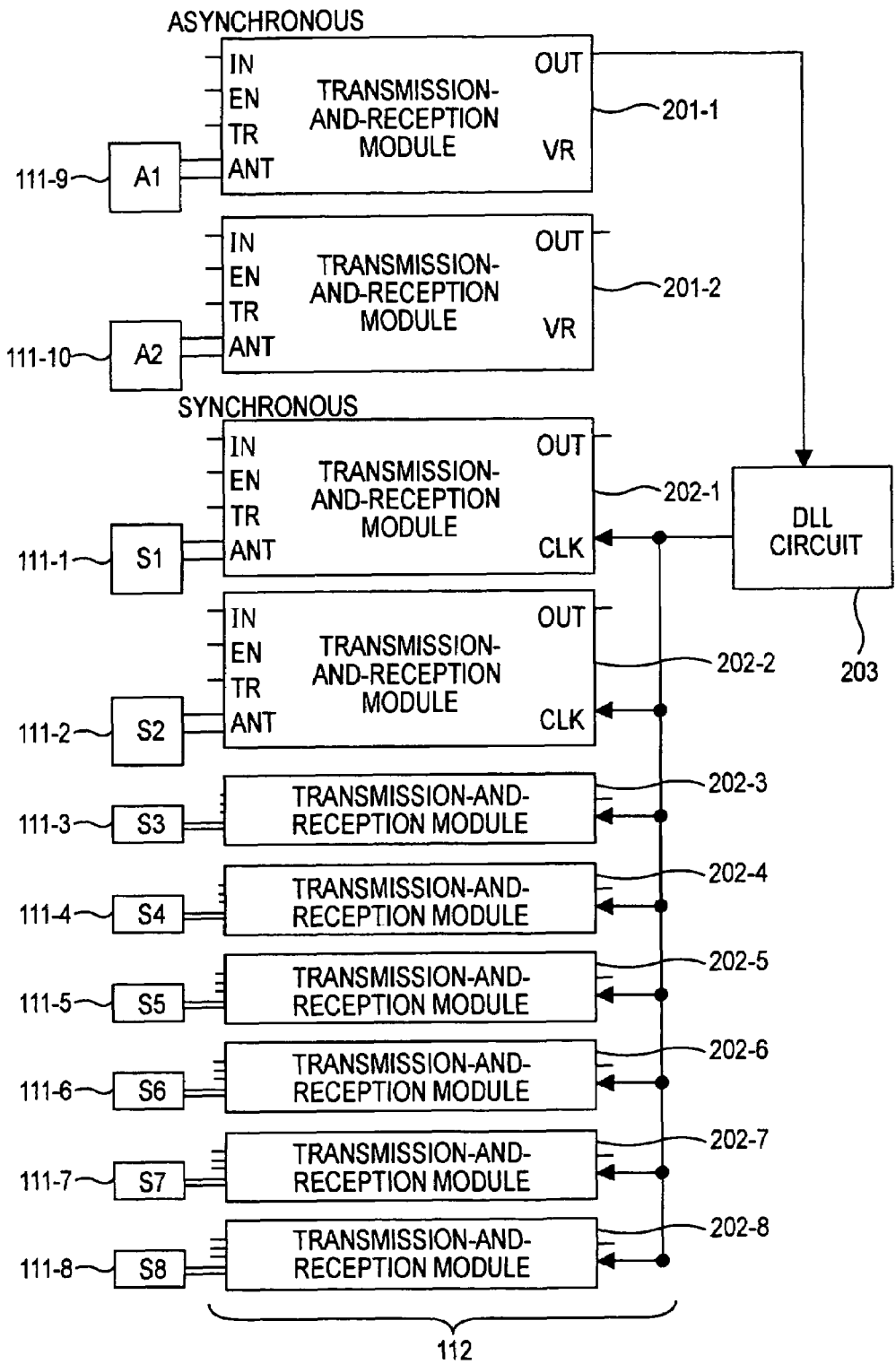
FIG. 7 is a block diagram showing the internal configuration of a mount chip of the communication board shown in FIG. 5.
Figure 9:
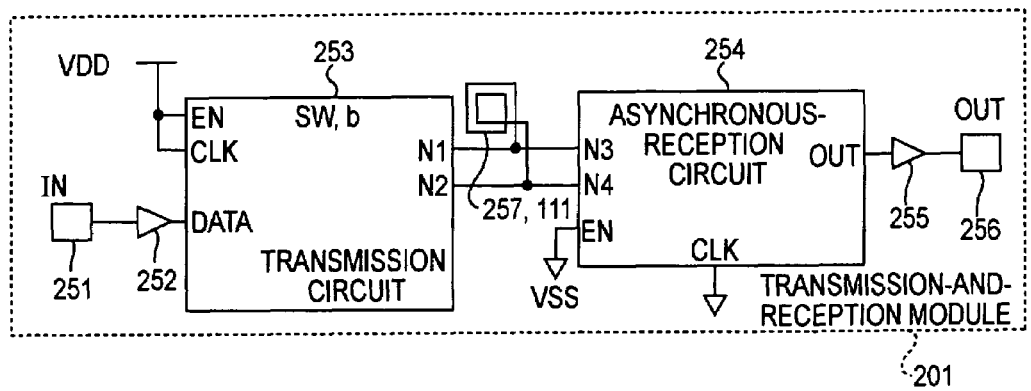
FIG. 9 is a block diagram illustrating the configuration of an asynchronous transmission-and-reception module of the mount chip.
Figure 10:
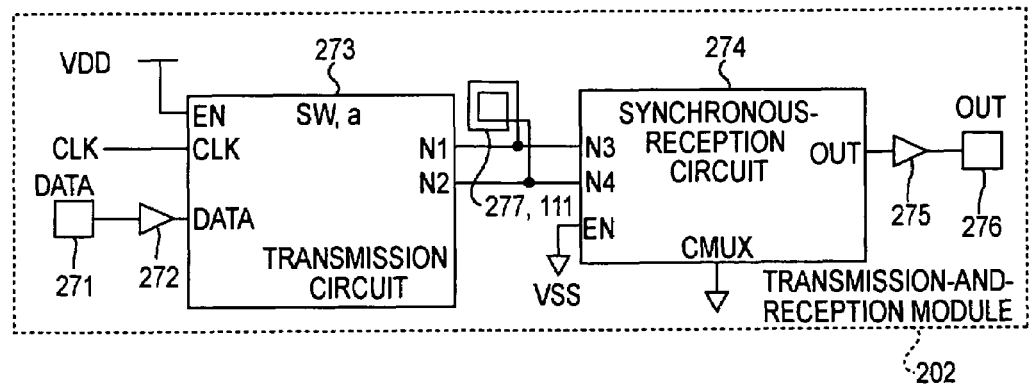
FIG. 10 is a block diagram illustrating the configuration of a synchronous transmission-and-reception module of the mount chip.

At least one of the above-described transmission circuits 253 and 273, and at least one of the above-described reception circuits 254 and 274 are asynchronous circuits such as transmission-and-reception modules 201-1 and 201-2 shown in FIG. 7, for example. The other circuits are synchronous circuits including transmission-and-reception modules 202-1, 202-2, 202-3, 202-4, 202-5, 202-6, 202-7, and 202-8 shown in FIG. 7, for example. Further, an adjustment circuit such as a digital-locked-loop (DLL) circuit 203 shown in FIG. 7 is provided, so as to adjust the phase of a clock signal transmitted to the above-described synchronous reception circuit on the basis of a signal transmitted from the above-described asynchronous reception circuit.

Where both the transmission circuits and the reception circuits are provided, namely, where the transmission circuit 253 and the asynchronous-reception circuit 254 that are shown in FIG. 9, and the transmission circuit 273 and the synchronous-reception circuit 274 that are shown in FIG. 10 are provided, the plurality of antennas 111 is connected to output ends of the transmission circuits 253 and 273, and input ends of the reception circuits 254 and 274. Each of the transmission circuits and the reception circuits has an end which is independently set to the enable state and/or the disable state. For example, each of the transmission circuit 253 and the asynchronous reception circuit 254 that are shown in FIG. 9, and the transmission circuit 273 and the synchronous reception circuit 274 that are shown in FIG. 10 has an enable end EN.

Hereinafter, embodiments of the present invention will be described with reference to the attached drawings.

Figure 2:
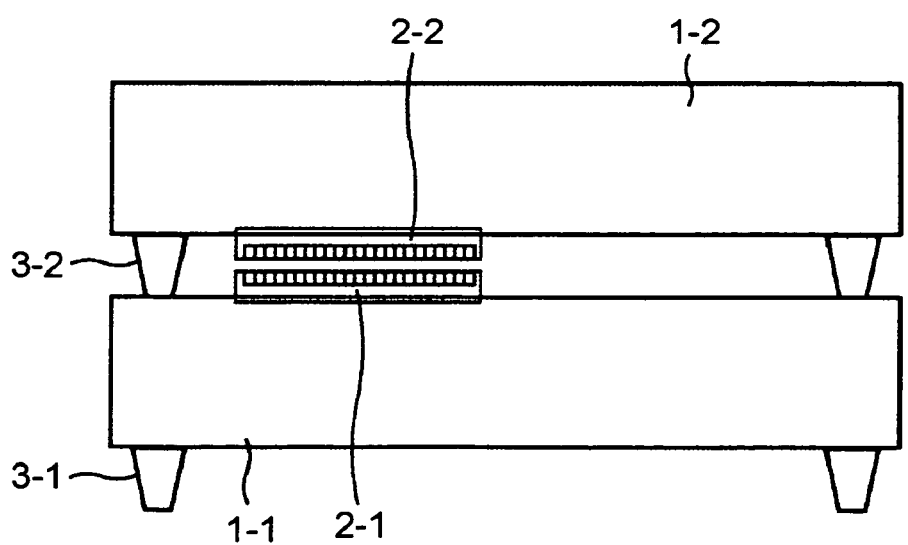
FIG. 2 is a perspective view illustrating electronic devices shown in FIG. 1, the electronic devices being coupled to each other.

As has been described, FIG. 1 shows the configuration of the electronic device 1-1 on which the communication board 2-1 is mounted, as a device board. Likewise, the communication board 2-2 is mounted on the electronic device 1-2, as the device board. The electronic devices 1-1 and 1-2 are stacked on each other, as shown in FIG. 2. According to an embodiment shown in FIG. 2, the electronic device 1-2 is provided on the electronic device 1-1. The electronic device 1-1 has a leg unit 3-1 and the electronic device 1-2 has a leg unit 3-2. The communication board 2-1 is mounted on the top face of the electronic device 1-1 in an exposed position and the communication board 2-2 is mounted on the under face of the electronic device 1-2 in an exposed position. The distance between the electronic devices 1-1 and 1-2 is fixed due to the leg unit 3-2. As a result, the communication boards 2-1 and 2-2 are opposed and in close proximity to each other. Further, very-short-distance communications are performed between the communication boards 2-1 and 2-2, as will be described later. Subsequently, the electronic devices 1-1 and 1-2 can transmit and/or receive signals to and/or from each other via no wiring.

Figure 3:
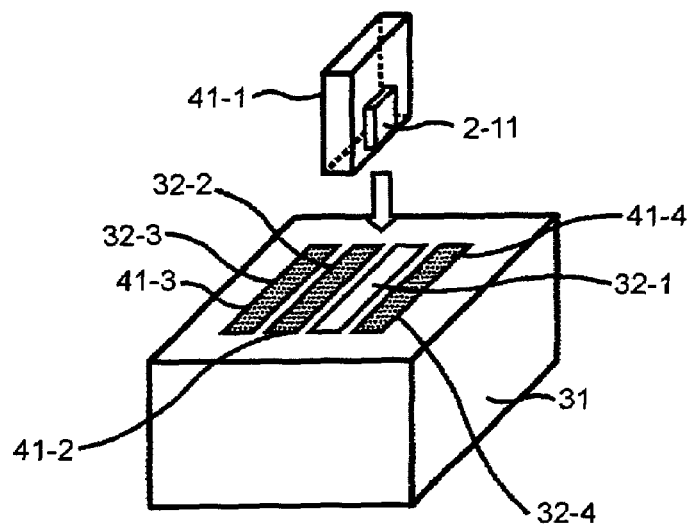
FIG. 3 is a perspective view showing the configuration of another embodiment of the present invention.

FIG. 3 shows another embodiment of the present invention. Namely, slots 32-1, 32-2, 32-3, and 32-4 are formed in an electronic device 31. Electronic devices 41-1, 41-2, 41-3, and 41-4 are mounted into the slots 32-1, 32-2, 32-3, and 32-4. Each of the electronic devices 41-1 to 41-4 includes electronic circuits configured to perform various functions, where the electronic circuits include a function board, a memory module, and so forth. Communication boards 2-11, 2-12, 2-13, and 2-14 are mounted on the electronic devices 41-1, 41-2, 41-3, and 41-4. In FIG. 3, only the communication board 2-11 is shown and the other communication boards 2-12 to 2-14 are not shown. The electronic device 31 includes communication boards provided at predetermined positions so that the communication boards are opposed to the communication boards 2-11 to 2-14. Subsequently, very-short-distance communications can be performed between the above-described communication boards.

Figure 4:
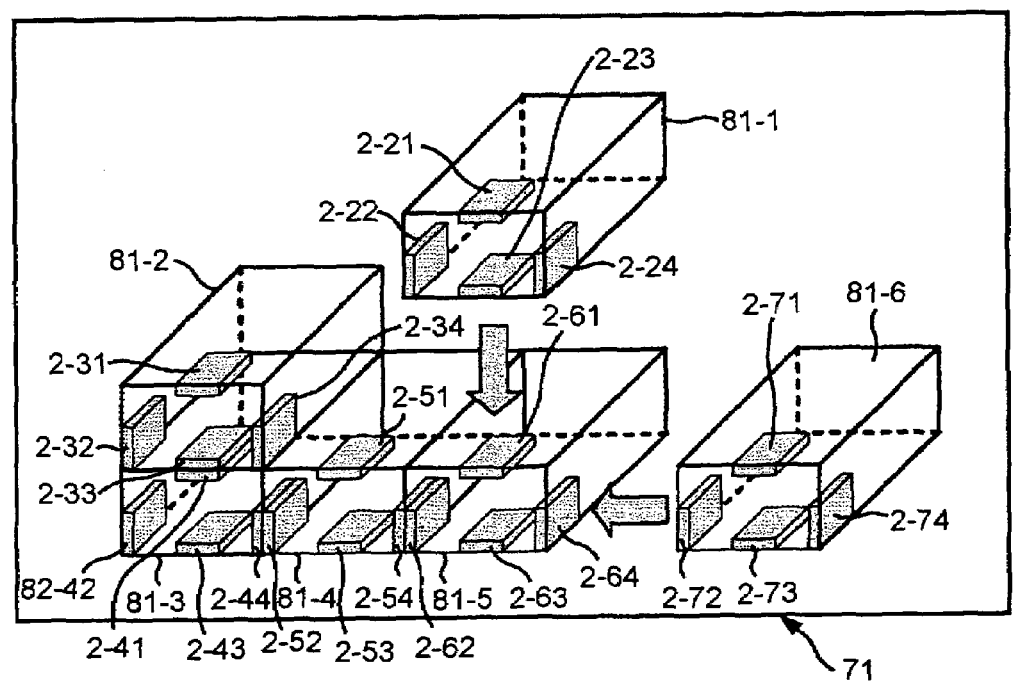
FIG. 4 is a perspective view showing the configuration of another embodiment of the present invention.

FIG. 4 shows an electronic device 71 according to another embodiment of the present invention. The electronic device 71 includes electronic-device sub-blocks 81-1, 81-2, 81-3, 81-4, 81-5, and 81-6 that are of the same shape. Each of the electronic-device sub-blocks 81-1 to 81-6 includes an electronic circuit or the like configured to perform a predetermined function. Further, a communication board 2-21 is mounted on the top face of the electronic-device sub-block 81-1, a communication board 2-22 is mounted on the left face of the electronic-device sub-block 81-1, a communication board 2-23 is mounted on the under face of the electronic-device sub-block 81-1, and a communication board 2-24 is mounted on the right face of the electronic-device sub-block 81-1. Likewise, communication boards 2-31, 2-32, 2-33, and 2-34, communication boards 2-41, 2-42, 2-43, and 2-44, communication boards 2-51, 2-52, 2-53, and 2-54, and communication boards 2-61, 2-62, 2-63, and 2-64, and communication boards 2-71, 2-72, 2-73, and 2-74 are mounted on the top faces, left faces, under faces, and right faces of the electronic-device sub-blocks 81-2, 81-3, 81-4, 81-5, and 81-6, respectively.

Where the electronic-device sub-blocks 81-1 to 81-6 are provided, as shown in FIG. 4, namely, where the electronic-device sub-block 81-2 is provided on the electronic-device sub-block 81-3, the electronic-device sub-block 81-4 is provided on the right of the electronic-device sub-block 81-3, the electronic-device sub-block 81-5 is provided on the right of the electronic-device sub-block 81-4, the electronic-device sub-block 81-6 is provided on the right of the electronic-device sub-block 81-5, and the electronic-device sub-block 81-1 is provided on the electronic-device sub-block 81-5, the communication board 2-33 provided on the under face of the electronic-device sub-block 81-2 is opposed to the communication board 2-41 provided on the top face of the electronic-device sub-block 81-3.

Likewise, the communication board 2-44 provided on the right face of the electronic-device sub-block 81-3 is opposed to the communication board 2-52 provided on the left face of the electronic-device sub-block 81-4, the communication board 2-54 provided on the right face of the electronic-device sub-block 81-4 is opposed to the communication board 2-62 provided on the left face of the electronic-device sub-block 81-5, the communication board 2-64 provided on the right face of the electronic-device sub-block 81-5 is opposed to the communication board 2-72 provided on the left face of the electronic-device sub-block 81-6, and the communication board 2-61 provided on the top face of the electronic-device sub-block 81-5 is opposed to the communication board 2-23 provided on the under face of the electronic-device sub-block 81-1. Very-short-distance communications are performed between the communication boards opposed to each other so that a signal is transmitted and/or received between the communication boards wirelessly (electromagnetic induction).

Thus, it becomes possible to transmit and/or receive a signal without using wiring only by providing an electronic device having necessary functions (an electronic-device sub-block) next to a predetermined electronic device, which facilitates performing assembly processing and manufacturing processing.

Hereinafter, since there may be no need to differentiate between the communication boards 2-1, 2-2, and so forth, the communication boards are collectively referred to as a communication board 2, as is the case with other devices and/or units.

Figure 5:
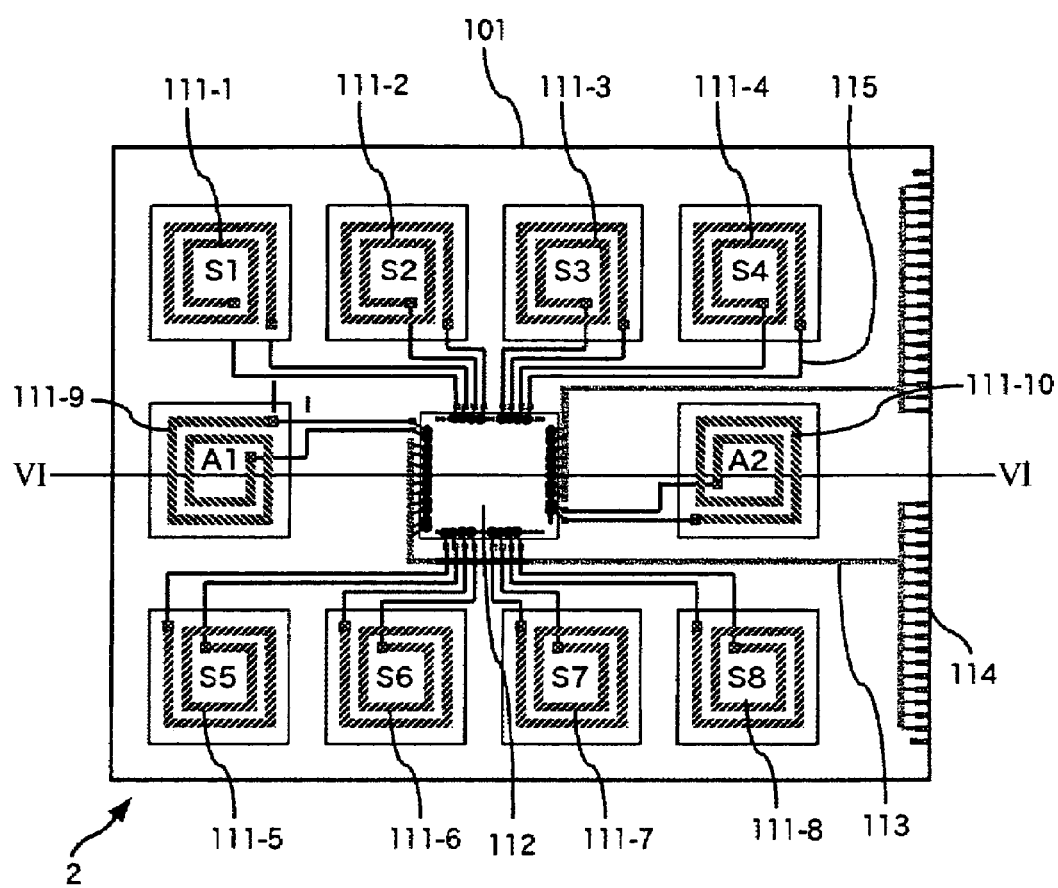
FIG. 5 is a plan view showing the configuration of a communication board according to the above-described embodiments.

FIG. 5 shows a plane construction of the communication board 2. As shown in FIG. 5, the communication board 2 is flat-shaped, and includes the substrate 101 and antennas 111-1, 111-2, 111-3, 111-4, 111-5, 111-6, 111-7, 111-8, 111-9, and 111-10, where each of the antennas 111 is provided on the substrate 101, as a coil-shaped wiring pattern (wiring layer). The mount chip 112 is provided roughly at the center of the antennas 111-1 to 111-10. The mount chip 112 is connected to each of the antennas 111-1 to 111-10 via the wiring pattern 115. Further, the mount chip 112 is connected to the input-and-output end 114 via the wiring pattern (wiring layer) 113. The input-and-output end 114 is mechanically connected to another input-and-output end so that a signal is transmitted and/or received between the input-and-output end 114 and other electronic part.

The substrate 101 includes resin such as FR4 (glass epoxy), polyimide, and so forth. As shown in FIG. 6, the substrate 101 has four layers including the wiring pattern 113 functioning as the topmost wiring layer and the wiring layers 152, 153, and 154. The antenna 111 is formed, as the lowermost (outermost) wiring layer 154. Of course, the antenna 111 may be formed, as a wiring layer which is more inside than the wiring layer 154 is. The mount chip 112 is mounted on the substrate 101 and connected to a pad 155 via the bonding wire 151. A protection film 156 is provided on each of the top face and the under face of the substrate 101, so as to protect the substrate 101. The protection films 156 include a polyimide film, a sealing material, and so forth.

FIG. 7 shows the internal configuration of the mount chip 112. In the mount chip 112, the transmission-and-reception modules 201-1 and 201-2, and the transmission-and-reception modules 202-1 to 202-8 are provided, so as to correspond to the antennas 111-1 to 111-10 on the one-to-one basis. The transmission-and-reception modules 201-1 and 201-2 are connected to the antennas 111-9 and 111-10, and the transmission-and-reception modules 202-1 to 202-8 are connected to the antennas 111-1 to 111-8. Each of the transmission-and-reception modules 202-1 and 202-2 transmits and/or receives a signal asynchronous with a clock signal. On the contrary, each of the transmission-and-reception modules 202-1 and 202-8 transmits and/or receives a signal synchronous with the clock signal. The transmission-and-reception module 201-1 transmits a clock signal generated from the signal transmitted thereto to the DLL circuit 203. The DLL circuit 203 delays the clock signal transmitted thereto by as much as a predetermined time period (phase adjustment) and transmits the clock signal to the transmission-and-reception modules 202-1 to 202-8. Each of the transmission-and-reception modules 202-1 to 202-8 transmits and/or receives a signal in synchronization with the clock signal transmitted from the DLL circuit 203.

Figure 8:
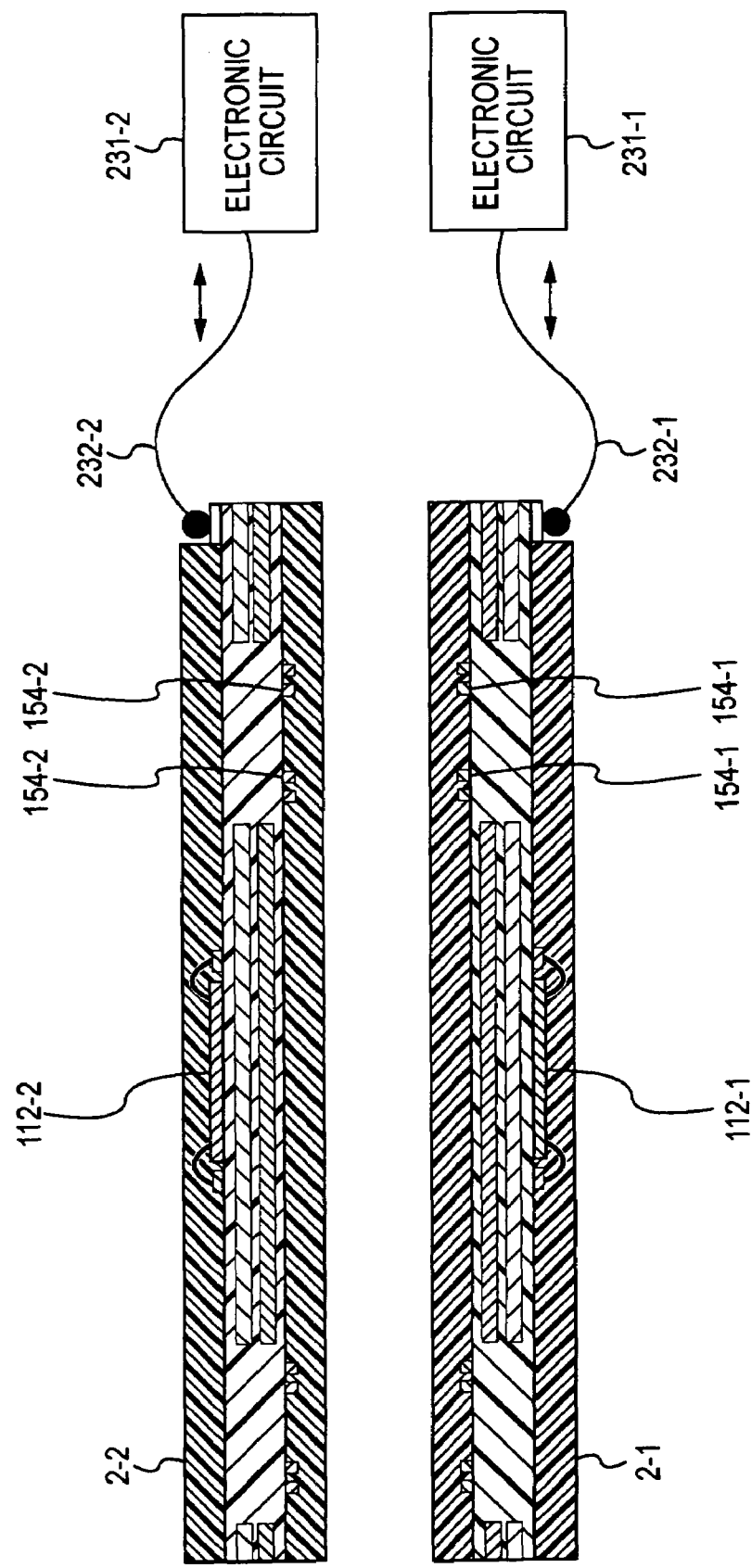
FIG. 8 shows the connection relationship between the communication boards and electronic circuits.

FIG. 8 shows the connection relationship between the communication board of each of the electronic devices and the electronic circuit provided in the electronic device. As shown in FIG. 8, the communication board 2-1 mounted on the electronic device 1-1 is connected to the electronic circuit 231-1 provided in the electronic device 1-1 via a cord 232-1. Similarly, the communication board 2-2 mounted on the electronic device 1-2 is connected to the electronic circuit 231-2 provided in the electronic device 1-2 via a cord 232-2. A signal transmitted from the electronic circuit 231-1 is transmitted to the communication board 2-2 via the communication board 2-1 through the very-short-distance communications, and transmitted to the electronic circuit 231-2 via the cord 232-2. On the other hand, a signal transmitted from the electronic circuit 231-2 is transmitted to the communication board 2-2 via the cord 232-2 and transmitted to the communication board 2-1 through the very-short-distance communications. The signal transmitted to the communication board 2-1 is transmitted to the electronic circuit 231-1 via the cord 232-1. Thus, the electronic circuits 231-1 and 231-2 can perform processing necessary for each other.

As shown in FIG. 9, the asynchronous transmission-and-reception module 201 includes an input-and-output end 251, an amplifier 252, a transmission circuit 253, an asynchronous-reception circuit 254, an amplifier 255, an output end 256, and an antenna 257, for example. When the transmission-and-reception module 201 operates, as a transmission circuit, an enable end EN and a clock end CLK of the transmission circuit 253 are connected to a high-level reference potential VDD. Subsequently, the transmission circuit 253 is set to the enable state. On the other hand, a low-level reference potential VSS is connected to an enable end EN of the asynchronous-reception circuit 254. Subsequently, the asynchronous-reception circuit 254 is set to the disable state.

A signal transmitted from the input end 251 is amplified by the amplifier 252 and transmitted to a data end (Data) of the transmission circuit 253. The transmission circuit 253 performs waveform shaping for the transmitted signal and transmits the signal to the antenna 257 corresponding to the antenna 111 shown in FIG. 5. As a result, the signal is transmitted from the antenna 257 (111).

As shown in FIG. 10, the synchronous transmission-and-reception module 202 includes an input end 271, an amplifier 272, a transmission circuit 273, a synchronous-reception circuit 274, an amplifier 275, an output end 276, and an antenna 277. When the transmission-and-reception module 202 functions, as a transmission circuit, an enable end EN of the transmission circuit 273 is connected to a high-level reference voltage VDD and a predetermined clock signal is transmitted to a clock end CLK. On the other hand, an enable end EN of the synchronous-reception circuit 274 is connected to a low-level reference potential VSS and set to the disable state.

A signal transmitted from the input end 271 is amplified by the amplifier 272 and transmitted to the transmission circuit 273. The transmission circuit 273 performs waveform shaping for the transmitted signal and transmits the signal to the antenna 277 corresponding to the coils shown in FIG. 5, that is, the antenna 111. Subsequently, the signal is transmitted from the antenna 277.

Figure 11:
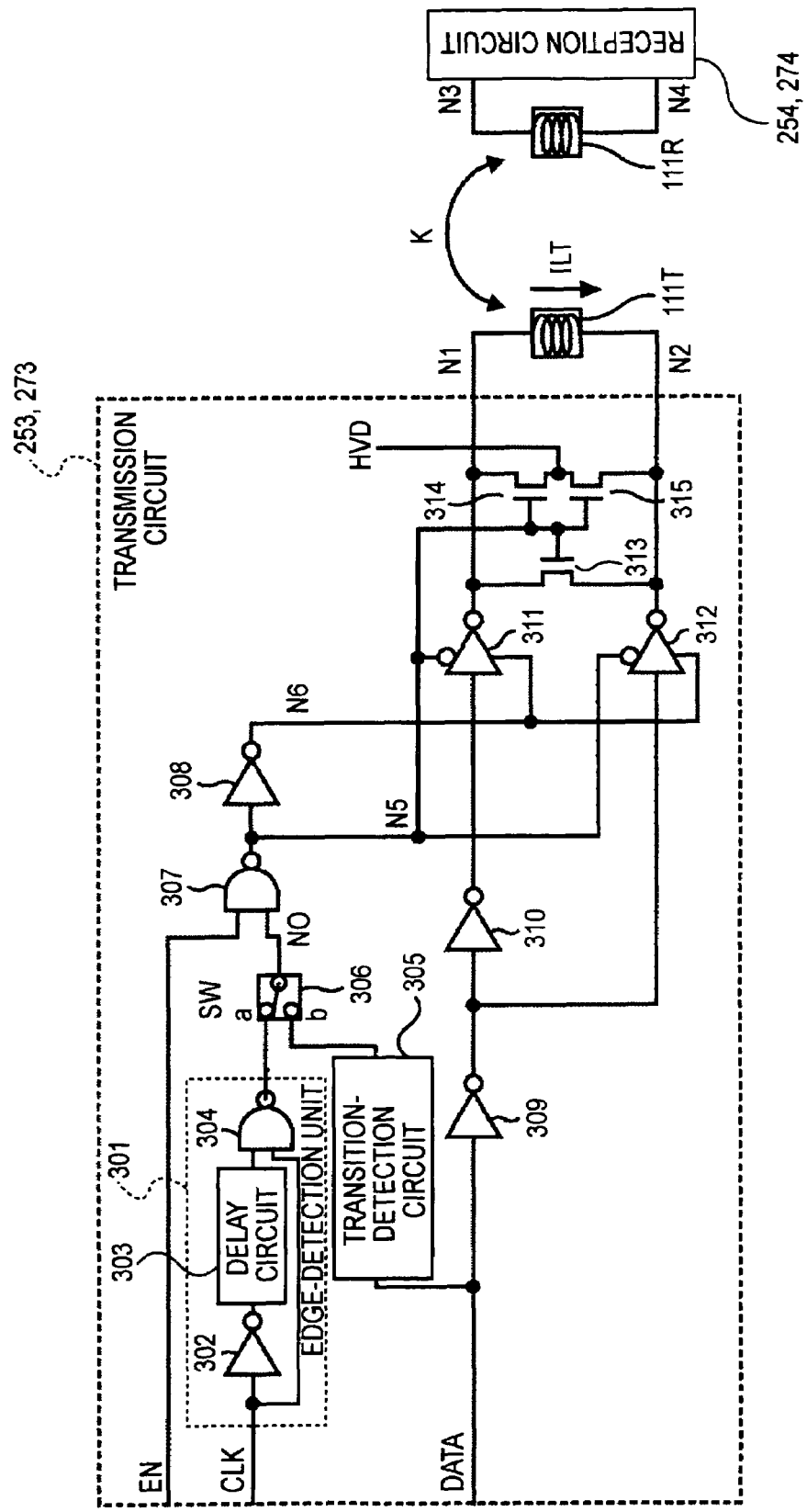
FIG. 11 is a circuit diagram showing the configuration of a transmission circuit.

FIG. 11 shows the configuration of the asynchronous-transmission circuit 253 that can be used, as the synchronous-transmission circuit 273. That is to say, the transmission circuit 253 can be used, as either a synchronous-transmission circuit or an asynchronous-transmission circuit. A signal transmitted from an enable end EN is transmitted to one of input ends of a NAND circuit 307. A clock signal transmitted from a clock end CLK is transmitted to an edge-detection unit 301. The edge-detection unit 301 includes an inverter 302, a delay circuit 303, and a NAND circuit 304. The signal transmitted from the edge-detection unit 301 is transmitted to the other input end of the NAND circuit 307 via a contact point a of a switch 306. When a signal is transmitted from a data end Data, a transition-detection unit 305 detects the transition of the signal, and the signal is transmitted to the other input end of the NAND circuit 307 via a contact point b of the switch 306.

An output signal transmitted from the NAND circuit 307 (an output signal of a node N5) is inverted by an inverter 308 and transmitted to a node N6. Each of tristate buffers 311 and 312 is set to the enable state and/or the disable state according to the output signal of each of the nodes N5 and N6.

Where the tristate buffers 311 and 312 are set to the enable state, input data is transmitted to the tristate buffer 312 via an inverter 309. An output from the inverter 309 is transmitted to the tristate buffer 311 via an inverter 310. An output signal transmitted from the tristate buffer 311 and that transmitted from the tristate buffer 312 are transmitted to both ends of transmission antenna 111T, where the both ends include output ends N1 and N2. A transistor 313 is connected between the output ends N1 and N2. Further, a series circuit including transistors 314 and 315 is connected between the output ends N1 and N2. The gate of each of the transistors 313 to 315 is connected to the node N5. A connection point where the transistor 314 and the transistor 315 are connected to each other is connected to a reference potential HVD. The value of the reference potential HVD is determined to be one-second of the value of the reference potential VDD.

The antenna 111T of a transmission-and-reception module on the transmission side is electromagnetically coupled to an antenna 111R of a transmission-and-reception module on the reception side by coupling coefficient K. A signal transmitted to the antenna 111R is transmitted to the asynchronous-reception circuit 254, or the synchronous-reception circuit 274 via an input end N3 and/or an input end N4.

Figure 12:
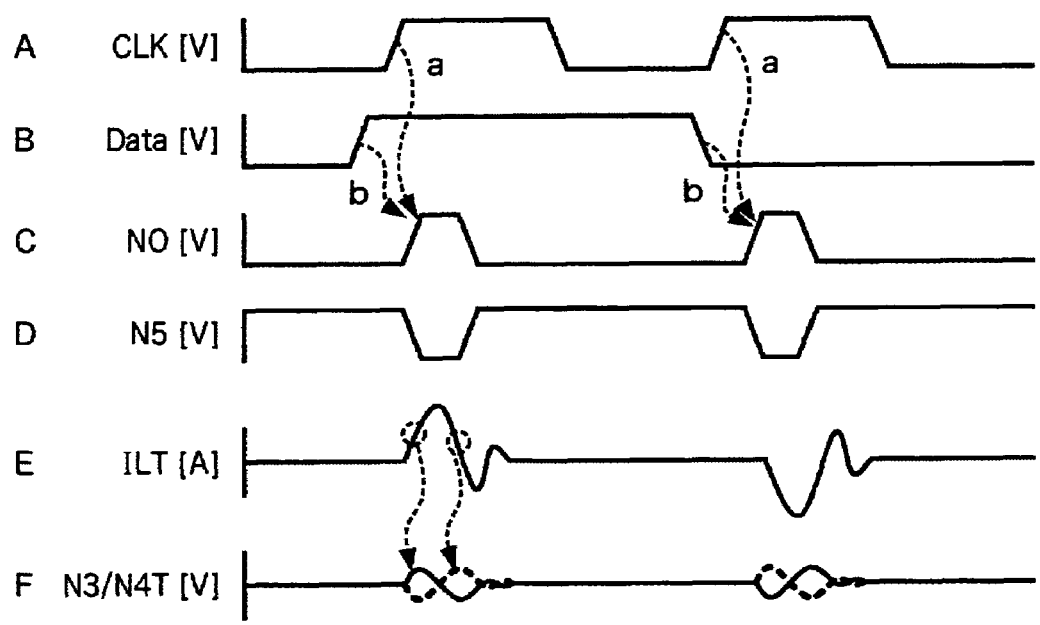
FIG. 12 shows waveform diagrams illustrating operations of the transmission circuit shown in FIG. 11.

Next, processing procedures performed by the transmission circuit 253 (273) shown in FIG. 11 will be described with reference to a timing chart shown in FIG. 12.

When the above-described transmission circuit 253 is selected, as the transmission circuit 273 which operates in synchronization with a clock signal, the switch 306 is switched to the contact-point-a side. In that case, the edge-detection unit 301 detects the rising edge of the clock signal transmitted from the end CLK (FIG. 12A) and the clock signal is transmitted to a node N0 via the contact point a of the switch 306 (FIG. 12C).

Where it is determined that the above-described transmission circuit 253 shown in FIG. 11 operates asynchronously with the clock signal, the switch 306 is switched to the contact-point-b side. Further, the transition-detection unit 305 detects the rising edge and the falling edge of data from a signal transmitted from a data end (FIG. 12B), and the rising edge and the falling edge are transmitted to the node N0 via the contact point b of the switch 306 (FIG. 12C).

The level of a signal transmitted from an enable end of the NAND circuit 307 may be determined to be high at all time. Therefore, when a high-level signal is transmitted to the node N0, a low-level signal is transmitted from an output end of the NAND circuit 307 to the node N5 (FIG. 12D). As a result, the inverter 308 transmits a high-level signal to a node N6. During the low-level signal is transmitted to the node N5 and the high-level signal is transmitted to the node N6, the tristate buffers 311 and 312 are set to the enable state. As a result, the tristate buffer 311 transmits a signal transmitted from the data end via the inverters 309 and 310 to an end of the antenna 111T via an output end N1, as it is. Further, the tristate buffer 312 transmits the signal transmitted from the inverter 309 to the other end of the antenna 111T via an output end N2. Subsequently, a current ILT flows into the antenna 111T (FIG. 12E). As a result, a current flows into the antenna 111R on the reception side by electromagnetic induction.

Where the current ILT flowing through the antenna 111T increases, a voltage is generated in the reception antenna 111R, as indicated by a solid line shown in FIG. 12F. Where the current ILT flowing through the antenna 111T on the transmission side decreases, a voltage is generated, as indicated by a broken line shown in FIG. 12F.

Each of the transistors 313 to 315 is turned off during the low-level signal is transmitted to the node N5 and allows a current flowing into the antenna 111T.

Figure 13:
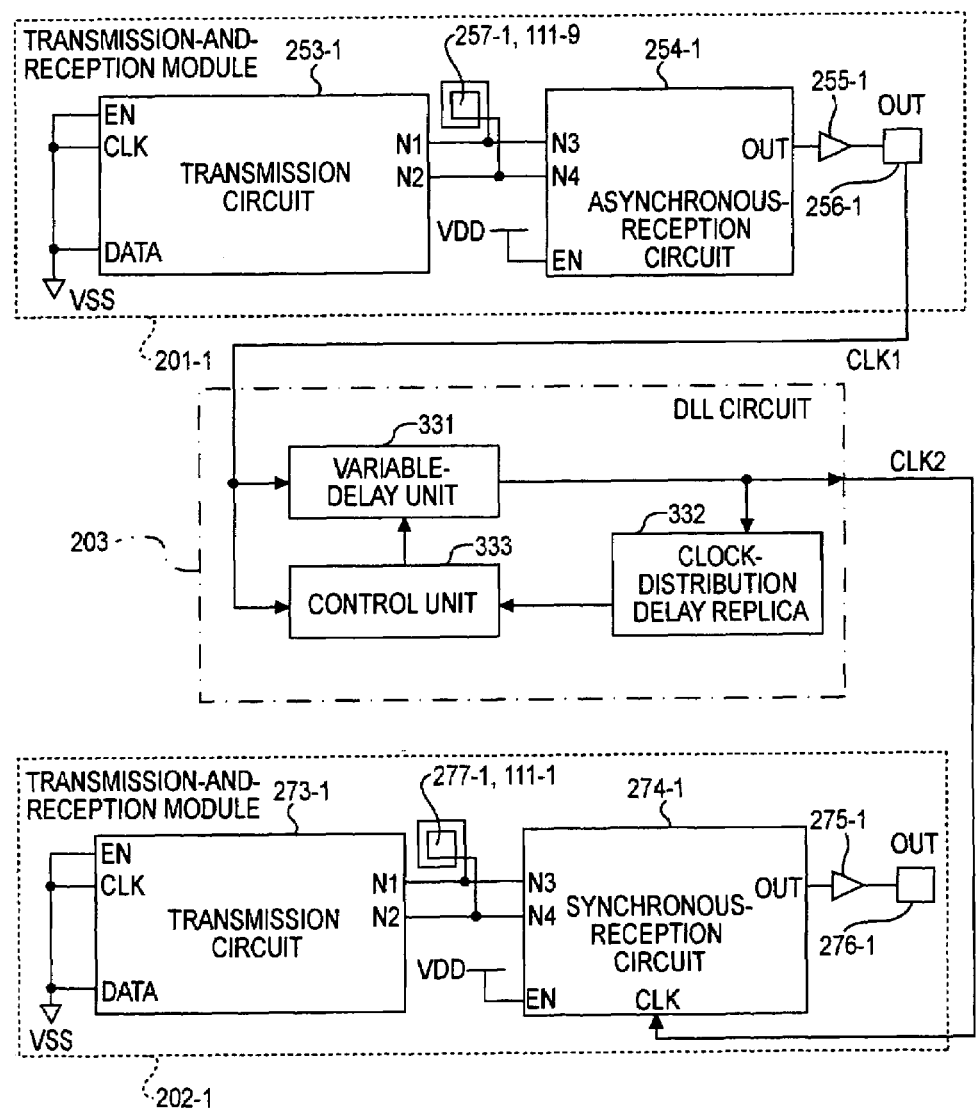
FIG. 13 is a block diagram illustrating the configuration of a transmission-and-reception module on the reception side.

FIG. 13 shows the configuration of a transmission-and-reception module on the reception side. For example, a clock signal is transmitted to the transmission-and-reception module 201-1 and transmitted to other transmission-and-reception module such as the transmission-and-reception module 202. In the asynchronous transmission-and-reception module 201-1, the low-level reference potential VSS is transmitted to each of an enable end, a clock end, and a data end of the transmission circuit 253-1. Therefore, the asynchronous transmission-and-reception module 201-1 is set to the disable state. In the asynchronous-reception circuit 254-1, the high-level reference voltage VDD is applied to an enable end of the asynchronous reception circuit 254-1. Subsequently, the asynchronous-reception circuit 254-1 is set to the enable state. Therefore, a signal transmitted to the antenna 257-1 (111-9) is transmitted to the asynchronous-reception circuit 254-1 and further transmitted to the amplifier 255-1 so that the signal is amplified by the amplifier 255-1. Then, the amplified signal is transmitted to the DLL circuit 203.

The DLL circuit 203 includes a variable-delay unit 331, a clock-distribution delay replica 332, and a control unit 333. The variable-delay unit 331 delays a clock signal transmitted thereto by as much as a predetermined time period and transmits the clock signal to the clock-distribution delay replica 332, as a clock signal CLK2. The clock-distribution delay replica 332 delays the transmitted clock signal CLK2 by as much as a predetermined time period and transmits the clock signal CLK2 to the control unit 333, as a clock signal CLK2B. The control unit 333 controls the variable-delay unit 331 so that the phase difference between the clock signal CLK1 transmitted from the asynchronous reception circuit 254-1 of the transmission-and-reception module 201-1 and the clock signal CLK2B transmitted from the clock-distribution delay replica 332 becomes zero.

Subsequently, the clock signal CLK2 is transmitted to a synchronous reception circuit 274-1 in synchronization with a clock signal transmitted from the transmission side, where the phase of the clock signal CLK 2 is adjusted so that the clock signal is transmitted at the same time when a signal is transmitted to an input end N3 and/or an input end N4 of the synchronous reception circuit 274-1.

Each of an enable end, a clock end, and a data end of a transmission circuit 273-1 of the synchronous transmission-and-reception module 202-1 is connected to a low-level reference potential VSS and set to the disable state. A high-level reference potential VDD is transmitted to an enable end of the synchronous-reception circuit 274-1 and the enable end is set to the enable state. Subsequently, a signal received by an antenna 277-1 (111-1) is transmitted to the synchronous-reception circuit 274-1 in synchronization with the clock signal CLK2, amplified by an amplifier 275-1, and transmitted from an output end 276-1.

Figure 14:
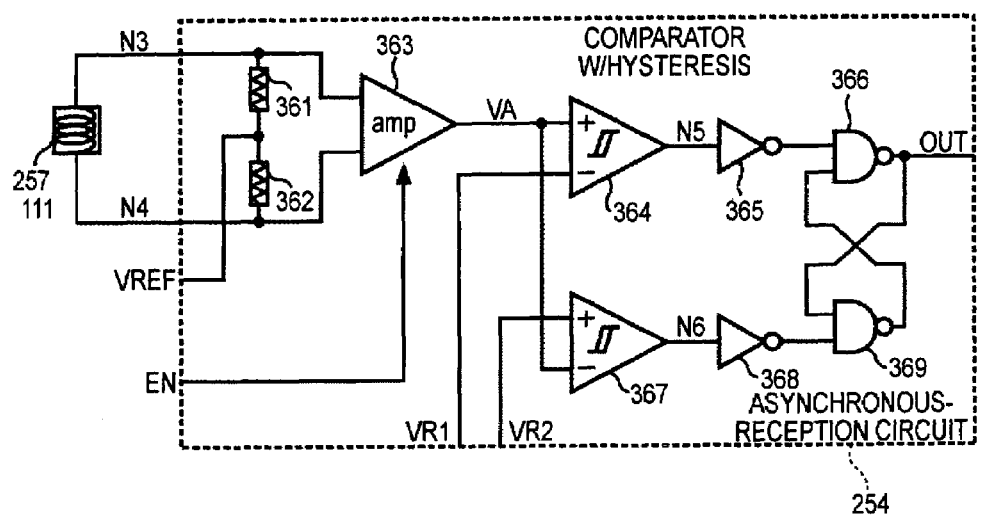
FIG. 14 is a circuit diagram illustrating the configuration of an asynchronous-reception module.

FIG. 14 shows the configuration of the asynchronous-reception circuit 254 more specifically. Namely, signals transmitted from the antenna 257 (111) are transmitted to both ends of the amplifier 363 via the input ends N3 and N4. Resistors 361 and 362 are connected in series between the input ends N3 and N4. A reference potential VREF is transmitted to a point where the resistors 361 and 362 are connected to each other. An output signal transmitted from the amplifier 363 is transmitted to each of a non-inversion input end of a hysteresis comparator 364 and an inversion-input end of a hysteresis comparator 367. A reference potential VR1 is transmitted to an inversion input end of the hysteresis comparator 364, as a threshold value, and a reference potential VR2 is transmitted to a non-inversion input end of the comparator 367, as another threshold value.

An output signal transmitted from the hysteresis comparator 364 (an output signal transmitted from the node N5) is inverted by an inverter 365 and transmitted to one of input ends of a NAND circuit 366, where the NAND circuit 366 and a NAND circuit 369 form a cross-latch circuit. Every time a low-level signal is transmitted, the cross-latch circuit inverts its output. An output signal transmitted from the comparator 367 (an output signal transmitted from the node N6) is inverted by the inverter 368 and transmitted to one of input ends of the NAND circuit 369. An output signal transmitted from the NAND circuit 366 is transmitted to the other input end of the NAND circuit 369 and an output signal transmitted from the NAND circuit 369 is transmitted to the other input end of the NAND circuit 366.

The signal transmitted from the antenna 257 is amplified by the amplifier 363 and transmitted to the non-inversion input end of the comparator 364. Where the level of the signal transmitted from the amplifier 363 is higher than that of the reference potential VR1, the comparator 364 transmits a positive pulse signal during that period. The positive pulse signal is inverted by the inverter 365. Further, the positive pulse signal inverts the cross-latch circuit including the NAND circuits 366 and 369, and the positive pulse signal is latched.

Where the level of the signal transmitted from the amplifier 363 is lower than that of the reference potential VR2, the comparator 367 transmits a positive pulse signal during that period. An output signal transmitted from the comparator 367 is inverted by the inverter 368, and latched and transmitted by the cross-latch circuit including the NAND circuits 366 and 369.

Figure 15:
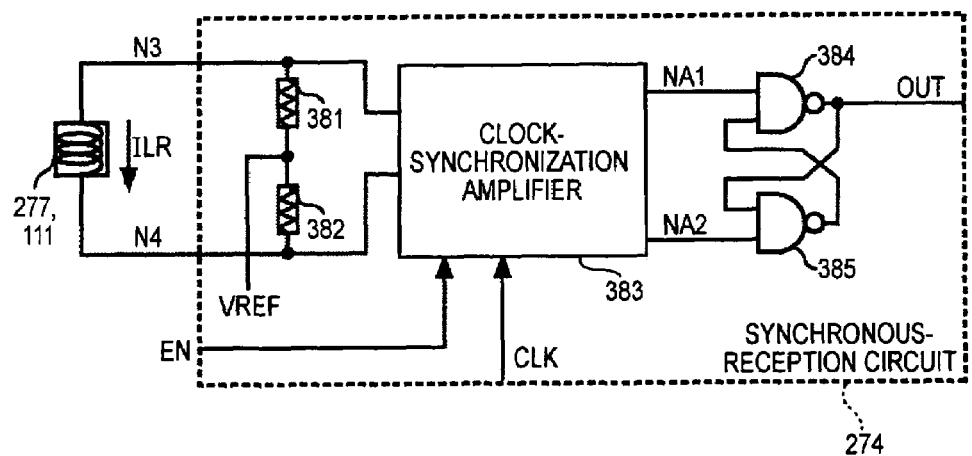
FIG. 15 is a circuit diagram illustrating the configuration of a synchronous-reception module.

FIG. 15 shows the configuration of the synchronous-reception circuit 274. As shown in FIG. 15, signals transmitted from the antenna 277 (111) for reception are transmitted to a clock-synchronization amplifier 383 via input ends N3 and N4. Resistors 381 and 382 are connected between the input ends N3 and N4. A reference potential VREF is transmitted to a connection point where the resistors 381 and 382 are connected to each other. An output signal transmitted from the clock-synchronization amplifier 383 is latched by a cross-latch circuit including NAND circuits 384 and 385, and transmitted from the cross-latch circuit.

The clock-synchronization amplifier 383 performs amplification operations in synchronization with a clock signal transmitted thereto.

Figure 16A:
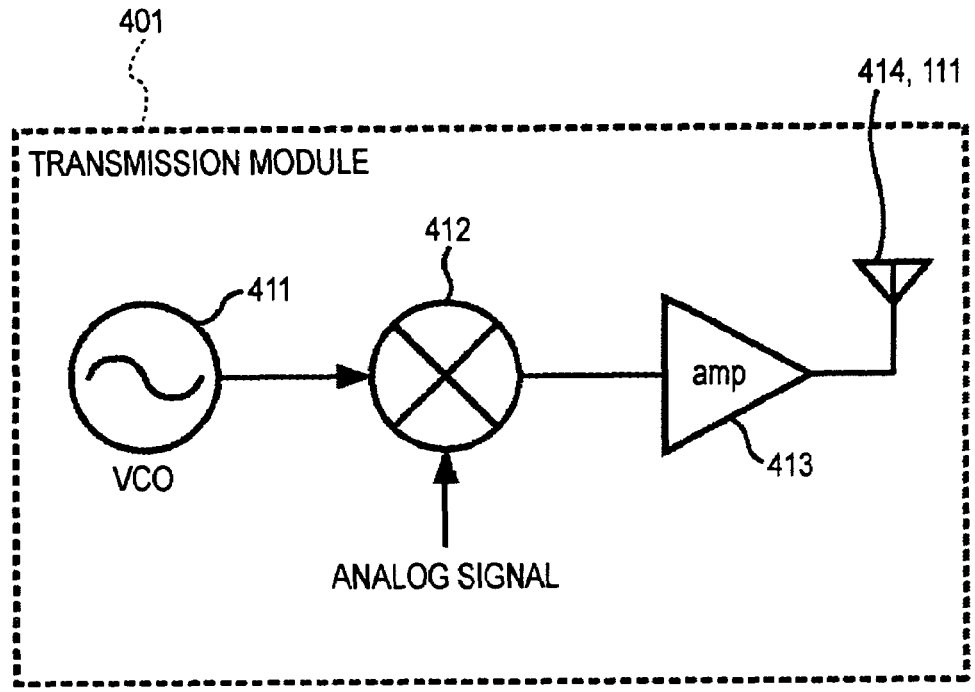
FIG. 16 is a block diagram illustrating the configuration of an analog transmission-and-reception module.
Figure 16B:
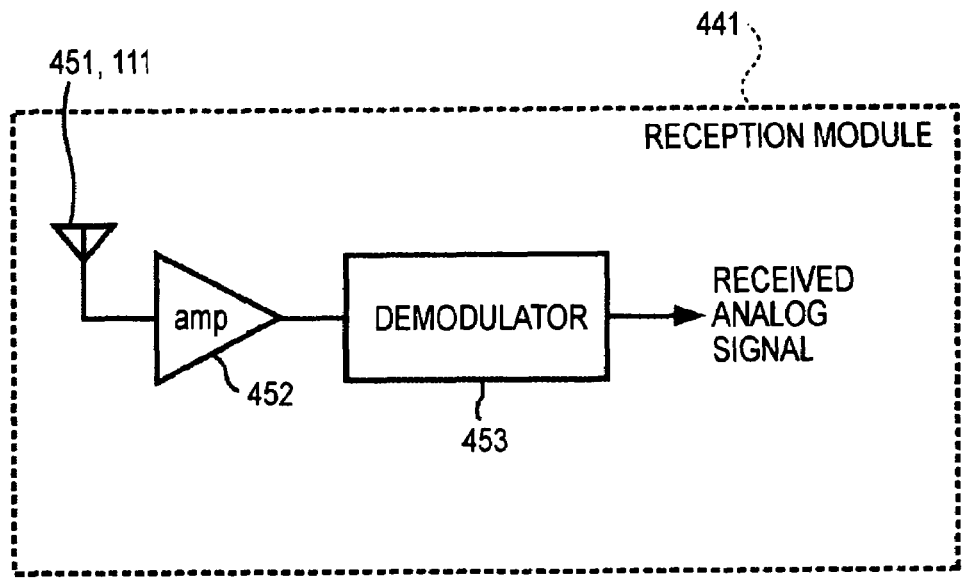

In the above-described embodiments, each of the transmitted and received signals is a digital signal. However, an analog signal can be transmitted and/or received in place of the digital signal. FIG. 16 shows a transmission-and-reception module wherein the analog signal is transmitted and/or received. In a transmission module 401, an output signal transmitted from a voltage-controlled oscillator (VCO) 411 is modulated on the basis of an analog signal transmitted from a modulator 412, amplified by an amplifier 413, and transmitted from an antenna 414 (111).

In a reception module 441, a signal transmitted from an antenna 451 (111) is amplified by an amplifier 452, demodulated by a demodulator 453, and transmitted from the demodulator 453.

Figure 17:
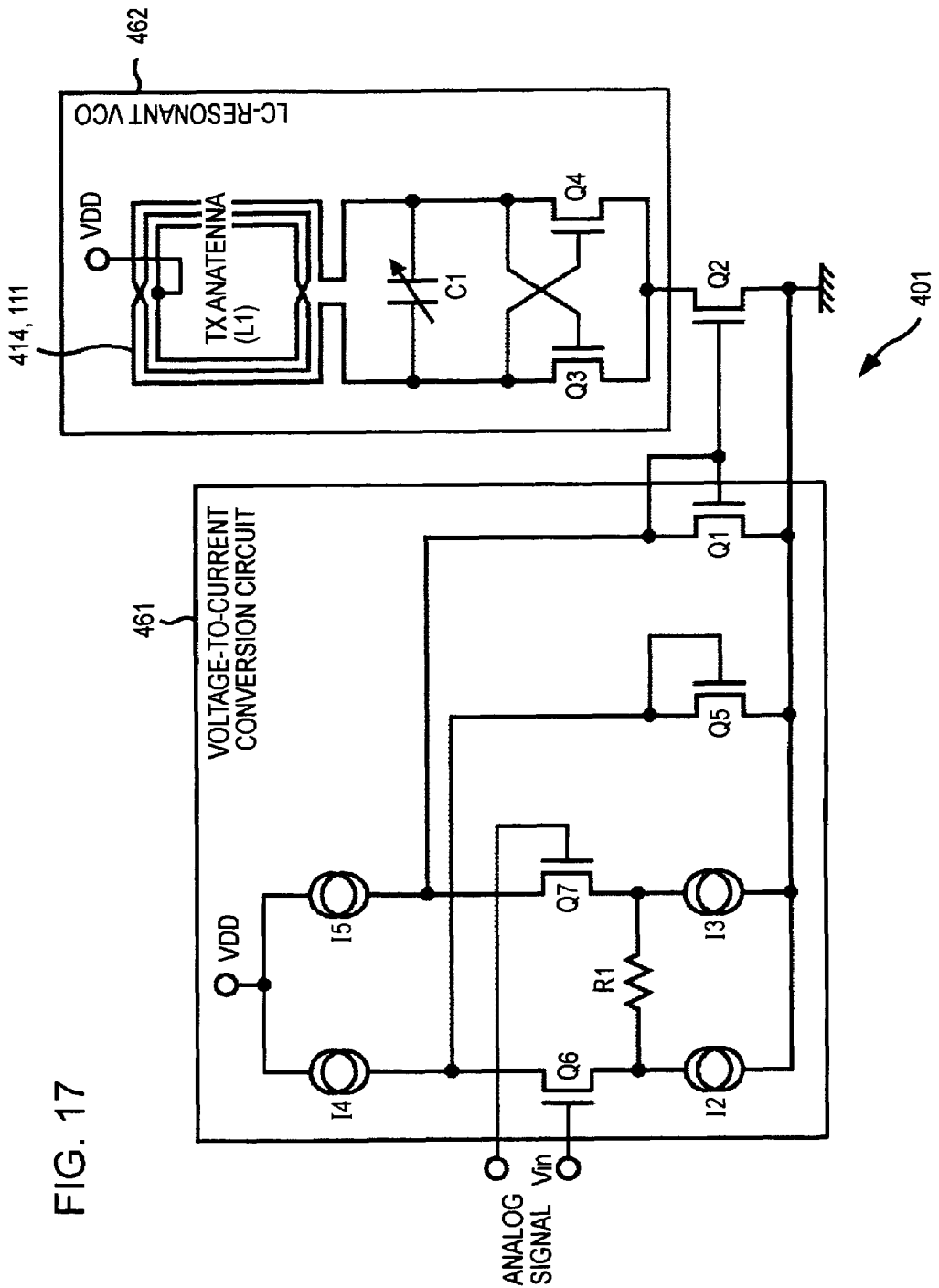
FIG. 17 is a circuit diagram showing the specific configuration of an analog-transmission module.

FIG. 17 specifically shows the configuration of the transmission module 401 which converts a voltage transmitted from a voltage-to-current conversion circuit 461 into a current. The voltage-to-current conversion circuit 461 includes constant-current sources I2, I3, I4, and I5, transistors Q1, Q5, Q6, and Q7, and a resistor R1.

Further, an output signal transmitted from the voltage-to-current conversion circuit 461 is transmitted to an LC-resonant VCO 462 via the transistor Q2. The LC-resonant VCO 462 includes an antenna 414 (111), a variable-capacitance capacitor C1, and transistors Q3 and Q4.

The value of the variable-capacitance capacitor C1 is controlled by an external voltage so that an oscillation frequency becomes variable.

The transistors Q3 and Q4 form a metal-oxide-semiconductor (MOS) differential pair. An oscillation frequency determined by an inductor L1 and the variable-capacitance capacitor C1 of the antenna 414 is represented by the following expression:

$$1/[2\pi\sqrt{(L1\times C1)}].$$

The transistors Q3 and Q4 function, as an amplifier. The transistor Q2 is a current sink which determines the value of a current flowing through the entire LC-resonant VCO 462.

Since the current amplitude of the LC-resonant VCO 462 is determined by the value of a current flowing through the transistor Q2, amplitude modulation (AM) can be performed by controlling the current value.

Currents flowing through the constant-current sources I2 and I3 are the same as each other and those flowing through the constant-current sources I4 and I5 are the same as each other. Further, the transistors Q6 and Q7 are of the same size and the transistors Q5 and Q1 are of the same size. Where the value of an input voltage Vin transmitted to the gate of each of the transistors Q6 and Q7 is zero, the voltages of source ends of the transistors Q6 and Q7 become the same as each other. Subsequently, no current flows into the resistor R1. At that time, currents I4 and I2 flow into the transistor Q5, and currents I5 and I3 flow into the transistor Q1.

Where the value of the input voltage Vin is positive and an input is small, the voltage corresponding to an input-potential difference is applied to the resistor R1. As a result, a current flows into the resistor R1 from the source end of the transistor Q6 toward the source end of the transistor Q7. At that time, the current value can be represented by the expression Vin/R1. Since each of the constant-current sources I2 and I3 transmits a constant current, a difference occurs between the values of currents flowing through the transistors Q6 and Q7 due to the current flowing through the resistor R1. Further, since each of the constant-current sources I4 and I5 transmits a constant current, the above-described current difference denotes the difference between currents flowing through the transistors Q5 and Q1. Therefore, the current flowing through the transistor Q1 can be represented by the following expression:

[(I5−I3)+Vin/R1].

The transistors Q1 and Q2 form a current mirror. Where the mirror ratio is determined to be M, the current flowing through the transistor Q2 is represented by the following expression:

M [(I5−I3)+Vin/R1].

Thus, the current I2 flowing through the transistor Q2 can be controlled on the basis of the input voltage Vin. Subsequently, AM modulation can be performed.

Figure 18:
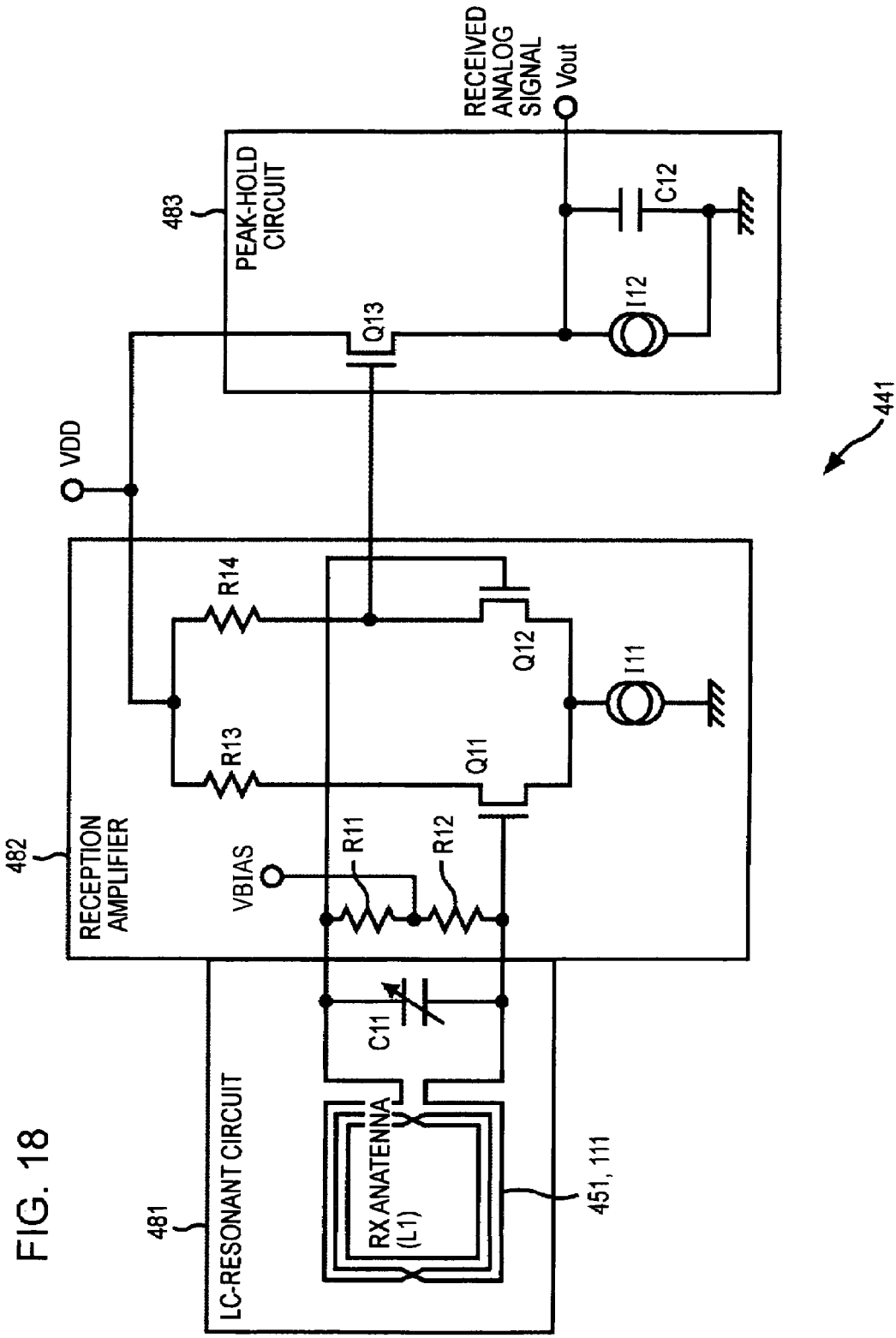
FIG. 18 is a circuit diagram showing the configuration of an analog-reception module.

FIG. 18 shows the specific configuration of the reception module 441 including an LC-resonant circuit 481, a reception amplifier 482, and a peak-hold circuit 483 functioning, as an AM demodulator. The LC-resonant circuit 481 includes the antenna 451 (111) and a variable-capacitance capacitor C11. The reception amplifier 482 includes resistors R11, R12, R13, and R14, transistors Q11 and Q12, and a constant-current source I11.

The peak-hold circuit 483 includes a transistor Q13, a constant-current source I12, and a capacitor C12.

The value of the variable-capacitance capacitor C11 is set, so as to achieve the maximum reception sensitivity. The transistors Q11 and Q12 are of the same size, and a value R of the resistor R13 is the same as that of the resistor R14. The transistors Q11 and Q12 form a MOS-differential pair. The gate of the transistor Q11 is biased at a predetermined potential via the resistor R11 and that of the transistor Q12 is biased at the predetermined potential via the resistor R12. The drain of the transistor Q11 is connected to a load resistor R13 and that of the transistor Q12 is connected to a load resistor R14. Each of the above-described drains also functions, as an output end. Each of the other end of the load resistor R13 and that of the load resistor R14 is connected to a reference potential VDD.

Signals transmitted from the antenna 451 (111) are subjected to voltage-to-current conversion by transconductance gm of each of the transistors Q11 and Q12, and applied to the load resistors R13 and R14. Since a voltage drop occurs in proportion to the values of currents flown into both ends of the resistors R13 and R14, the input voltage transmitted to each of the output ends is multiplied by (gm/2)×R.

When the current I12 flows through the transistor Q13, the value of a gate-to-source voltage is determined to be Vgs0 and the potential value of an output end is determined to be Vout. When the gate voltage of the transistor Q13 is lower than a voltage indicated by the expression Vout+Vgs0, the transistor Q13 is turned off and no current is transmitted from the transistor Q13 to the output end. Since the constant-current source I12 is connected to the output end, an electrical charge accumulated on the capacitor C12 is drawn by the constant-current source I12 and the potential Vout of the output end decreases by I12/C2 per unit time.

On the contrary, where the gate-voltage value of the transistor Q13 is higher than Vout+Vgs0, a current I12' larger than the current I12 flows into the transistor Q13. The difference between the current I12' and the current I12, that is, the current increase is accumulated on the capacitor C12 and the potential Vout of the output end increases.

Where the size of the transistor Q13 is sufficiently large, the potential Vout of the output end follows a change in the peak value of gate potential Vinpf of the transistor Q13. Therefore, peak-hold operations can be performed by appropriately determining the size of the transistor Q13 and the value of each of the constant-current source I12 and the capacitor C12.

It should be noted that communications can be performed by using an analog signal in addition to a synchronous logic signal and/or an asynchronous logic signal.

Although the number of antennas is ten in FIG. 5, the number may be determined to be one hundred or more. As the antenna number increases, so does the bit number of data for transmission. Subsequently, it becomes possible to transmit data stored in an internal bus of an electronic device to a predetermined device outside the cabinet of the electronic device. Where the number of antennas 111 is determined to be 64+a, 64-bit data can be transmitted at one time.

Accordingly, high-speed and wide-bit non-contact connection can be achieved, which makes it possible to perform module interchange without considering a contact resistance and/or impedance matching.

The above-described electronic devices can be configured on the function-by-function basis. Namely, the function of each of the electronic devices may be the memory function, the CPU function, the video function, and so forth. Therefore, a system can be configured by using the above-described functions (the electronic devices) in combination, as required. Subsequently, it becomes easy to add and change the functions of a system, and construct the system.

Accordingly, it becomes possible to add various functions to various electronic devices and/or apparatuses with facility, where the electronic devices and/or apparatuses include a personal computer, a television receiver, a mobile phone, and so forth.

It should be understood by those skilled in the art that various modifications, combinations, sub-combinations and alterations may occur depending on design requirements and other factors insofar as they are within the scope of the appended claims or the equivalents thereof.

What is claimed is:

1. A communication board comprising:
   a plurality of antennas configured to transmit and receive a signal by electromagnetic induction, where each of the plurality of antennas is provided on a substrate, as a coil-shaped pattern;
   a semiconductor chip mounted on the substrate, the semiconductor chip including a plurality of transmission and reception circuits, each of the transmission circuits transmit a signal to one of the plurality of antennas and each of the reception circuits receive a signal received from the one of the plurality of antennas, a transmission circuit and a reception circuit are asynchronous circuits, and the remaining transmission circuits and reception circuits are synchronous circuits; and an input-and-output end that is connected to the semiconductor chip via a wiring layer provided on the substrate and an electronic circuit of the electronic device, wherein the communication board communicates with another communication board via at least one of the antennas by electromagnetic induction.

2. The communication board according to claim 1, wherein the substrate includes a plurality of wiring layers and at least one of the antennas is formed by an outermost wiring layer.

3. The communication board according to claim 1, wherein the plurality of antennas are connected to an output of a respective transmission circuit and an input of a respective reception circuit, and wherein each of the transmission circuits and the reception circuits have an end which is set to an enable state and/or a disable state independently.

4. An electronic device comprising the communication board according to claim 1.

5. The communication board according to claim 1, further comprising:

an adjustment circuit configured to adjust a phase of a clock signal of the communication board on a basis of an output signal of the asynchronous reception circuit, and the clock signal is transmitted to the synchronous reception circuit to serve as a input clock for synchronous transmission.

6. The communication board according to claim 5, wherein the adjustment circuit includes a variable delay unit and a control unit that are configured to adjust a phase of the input clock of the synchronous reception circuit, so that a phase difference between the output signal of the asynchronous reception circuit and the input clock of the synchronous reception circuit is zero.

* * * * *